(12) United States Patent
Gardner et al.

(10) Patent No.: US 10,354,786 B2
(45) Date of Patent: Jul. 16, 2019

(54) HYBRID MAGNETIC MATERIAL STRUCTURES FOR ELECTRONIC DEVICES AND CIRCUITS

(71) Applicant: Intel Corporation, Santa Clara, CA (US)

(72) Inventors: Donald S. Gardner, Los Altos, CA (US); Gerhard Schrom, Hillsboro, OR (US); Edward A. Burton, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/283,350

(22) Filed: Oct. 1, 2016

(65) Prior Publication Data

US 2018/0096764 A1    Apr. 5, 2018

(51) Int. Cl.
*H01L 23/64* (2006.01)
*H01F 1/147* (2006.01)
*H01F 10/06* (2006.01)
*H01F 27/255* (2006.01)
*H01F 27/28* (2006.01)
*H01F 41/04* (2006.01)
*H01F 41/16* (2006.01)
*H01F 41/32* (2006.01)
*H01L 25/18* (2006.01)
(Continued)

(52) U.S. Cl.
CPC ......... *H01F 1/14733* (2013.01); *H01F 10/06* (2013.01); *H01F 17/0006* (2013.01); *H01F 27/255* (2013.01); *H01F 27/2804* (2013.01); *H01F 27/365* (2013.01); *H01F 41/041* (2013.01); *H01F 41/046* (2013.01); *H01F 41/16* (2013.01); *H01F 41/32* (2013.01); *H01L 23/645* (2013.01); *H01L 25/18* (2013.01); *H01L 28/10* (2013.01); *H05K 1/165* (2013.01); *H05K 3/0085* (2013.01); *H01F 41/18* (2013.01); *H01F 41/26* (2013.01); *H01F 2017/0066* (2013.01); *H05K 2201/086* (2013.01); *H05K 2201/09236* (2013.01)

(58) Field of Classification Search
CPC .... H01L 23/5227; H01L 23/645; H01L 28/10
See application file for complete search history.

(56) References Cited

U.S. PATENT DOCUMENTS 6,063,511 A * 5/2000 Purinton ............. H01F 1/15375
                                                                422/186
6,396,122 B1 * 5/2002 Howard .................. H01L 27/08
                                                                257/528
(Continued)

OTHER PUBLICATIONS

International Search Report and Written Opinion for PCT/US2017/049381, dated Dec. 28, 2017, 12 pages.
(Continued)

*Primary Examiner* — Benjamin P Sandvik
(74) *Attorney, Agent, or Firm* — Schwabe, Williamson & Wyatt P.C.

(57) ABSTRACT

Embodiments are generally directed to hybrid magnetic material structures for electronic devices and circuits. An embodiment of an inductor includes a first layer of magnetic film material applied on a substrate, one or more conductors placed on the first layer of magnetic film material, and a second layer of magnetic particles, wherein the magnetic particles are suspended in an insulating medium.

27 Claims, 8 Drawing Sheets

(51) Int. Cl.
   *H01L 49/02*   (2006.01)
   *H05K 3/00*    (2006.01)
   *H01F 17/00*   (2006.01)
   *H01F 27/36*   (2006.01)
   *H05K 1/16*    (2006.01)
   *H01F 41/26*   (2006.01)
   *H01F 41/18*   (2006.01)

(56) References Cited

U.S. PATENT DOCUMENTS

| | | |
|---|---|---|
| 2002/0090755 A1 | 7/2002 | Matsuzaki et al. |
| 2007/0247268 A1 | 10/2007 | Oya et al. |
| 2008/0044660 A1* | 2/2008 | Takaya .................. B32B 15/08 428/413 |
| 2008/0090079 A1 | 4/2008 | Fajardo et al. |
| 2009/0002117 A1* | 1/2009 | Kawarai ............ H01F 17/0006 336/233 |
| 2009/0045905 A1 | 2/2009 | Nakagawa et al. |
| 2009/0243780 A1* | 10/2009 | Inoue .................. H01F 1/15366 336/200 |
| 2010/0283570 A1* | 11/2010 | Lavoie ............... H01F 17/0006 336/200 |
| 2013/0292849 A1* | 11/2013 | Lin .................... H01L 21/76898 257/774 |
| 2015/0097267 A1* | 4/2015 | Tseng .................... H01L 28/10 257/531 |
| 2016/0172310 A1* | 6/2016 | Zhai ...................... H01L 23/552 257/659 |
| 2016/0247624 A1* | 8/2016 | Seo ....................... H01F 27/255 |
| 2016/0379747 A1* | 12/2016 | Wolter ................ H01F 17/0033 336/200 |

OTHER PUBLICATIONS

International Preliminary Report on Patentability for International Patent Application No. PCT/US2017/049381, dated Apr. 11, 2019, 9 pgs.

* cited by examiner

US 10,354,786 B2

HYBRID MAGNETIC MATERIAL STRUCTURES FOR ELECTRONIC DEVICES AND CIRCUITS

TECHNICAL FIELD

Embodiments described herein generally relate to the field of electronic devices and, more particularly, hybrid magnetic material structures for electronic devices and circuits.

BACKGROUND

A significant challenge in the design and fabrication of microelectronic devices such as inductors, including inductors utilized for power delivery, is that such devices are large and therefore difficult to incorporate onto a package or silicon die. Potential designs that may be operated at lower frequencies for power delivery require higher inductance values, thus generally require the use of magnetic material to enable the needed inductor operation.

A related issue is that on-die integrated inductors for power delivery at high current levels can require two levels of magnetic material, above and below the conductors of the inductor element, in order to maintain low DC resistance. However, the magnetic material required for integrated inductors is relatively thick and needs to be laminated in fabrication, and thus the fabrication of such inductors, utilizing, for example, high-vacuum sputter deposition or electroplating, requires long deposition times utilizing expensive deposition equipment.

BRIEF DESCRIPTION OF THE DRAWINGS

Embodiments described here are illustrated by way of example, and not by way of limitation, in the figures of the accompanying drawings in which like reference numerals refer to similar elements.

DETAILED DESCRIPTION

Figure 1:
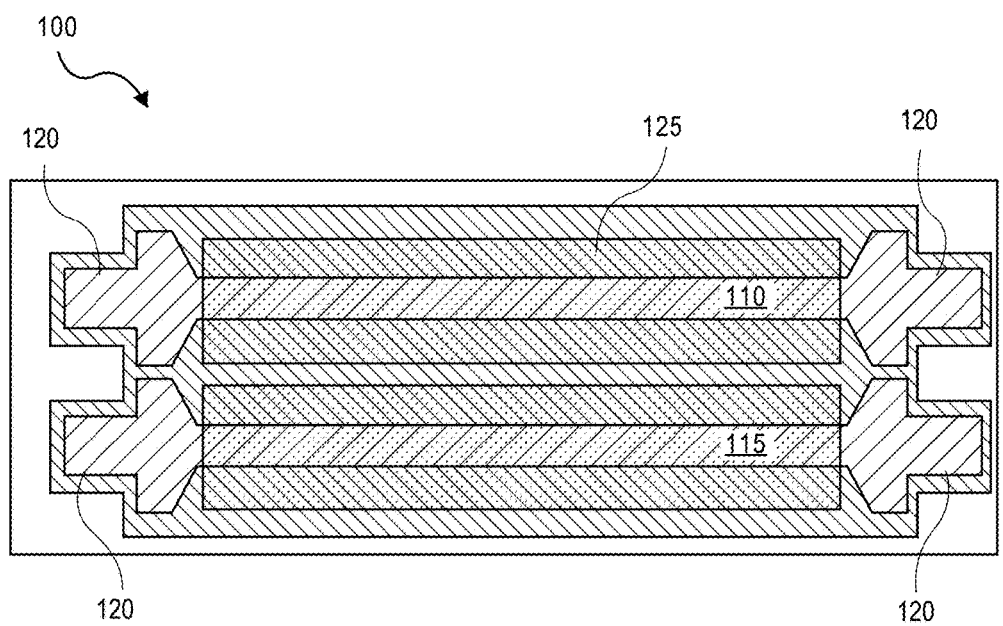
FIG. 1 is a representation of a microscopic image of an integrated inductor including magnetic film material.

Embodiments described herein are generally directed to hybrid magnetic material structures for electronic devices and circuits.

For the purposes of this description:

"Integrated inductor" refers to inductor that is integrated onto a substrate of a microelectronic package or chip. It can include integration into a system on a chip or system on a package.

"Eddy current" refers to an electric current in a conductor resulting from induction by a flowing or varying current, where eddy currents are in the form of closed loops and tend to flow counter to the flow of electric currents in the interconnections.

"Quality factor" or "Q" of an inductor refers to a measure of the efficiency of the inductor, wherein Q equals a ratio of inductive reactance to resistance at a given frequency.

Because inductors for integrated circuit operation such as power delivery typically are large, the fabrication process for such inductors commonly requires the deposition of a first layer of magnetic film material, the placement of copper conductors, and the deposition of a second layer of magnetic film material on the top of the copper conductors. The magnetic material may include an alloy such as iron alloys, Permalloy (an alloy of nickel and iron), other nickel alloys, cobalt alloys including amorphous cobalt alloys such as high permeability CZT (CoZrTa, or Cobalt Zirconium Tantalum), CoZrNb (Cobalt Zirconium Niobium), or CoP (Cobalt Phosphorus), which generally allows for high inductor performance, or other soft magnetic materials. Soft magnetic materials are materials that are easily magnetized or demagnetized, typically having an intrinsic coercivity of less than 1000 A/m (Ampere/meter), and being used to enhance or channel the flux produced by an electric current.

However, the fabrication of such an inductor is a slow and expensive process because of the multiple layers implemented by deposition of magnetic material, which are commonly deposited using high-vacuum sputter deposition systems, electroplating, or other similar deposition systems. As a result, the overall cost and difficulty in fabricating integrated inductors is high, and could benefit from a simplification of the process.

In some embodiments, an apparatus, system, or process eliminates the second magnetic film layer in the fabrication of an integrated inductor, replacing such layer with magnetic particles, which may also referred to herein as powdered magnetic material or micro-powder magnetic material. In some embodiments, a hybrid magnetic material inductor is implemented using a high-permeability magnetic material on a bottom layer in combination with a powdered magnetic material on a top layer, the powered magnetic material including micron-sized (generally in the range of 0.5 to 10.0 micrometers) magnetic particles. In this manner, a device with high levels of inductance and good quality factors may be produced in a less expensive and time consuming process in comparison with the high-vacuum sputter deposition of magnetic film material or electroplating of magnetic material for both top and bottom layers.

In some embodiments, the added magnetic material is a thick micrometer powder of magnetic particles in a matrix that may be applied for the top magnetic material layer using a particle application process, wherein the process is an additive manufacturing technique such as 3D printing, cold spraying, spin coating, screen printing, or other particle application processes. In some embodiments, the magnetic particle material includes carbonyl iron particles, which may include anodized particles, suspended in an insulating medium such as a polyimide or adhesive.

In some embodiments, application of powdered magnetic material is also applied for other uses in electronic devices and circuits. In some embodiments, powdered magnetic material is applied to provide electromagnetic shielding in an electronic circuit at a package or circuit board level to reduce EMI (electromagnetic interference), the use of magnetic particle deposition operating to simplify and reduce the cost of application of shielding in comparison with conventional shielding techniques.

In some embodiments, a method for generating electromagnetic shielding includes fabricating an electronic device or circuit on a circuit board or package; and applying an electromagnetic coating on all or a portion of electronic device or circuit, wherein applying the electromagnetic coating includes applying a layer of magnetic particles with a particle application process, the magnetic particles being suspended in an insulating medium.

FIG. 1 is a representation of a microscopic image of an integrated inductor including magnetic film material. As illustrated in FIG. 1, in a top view from above an inductor 100, the inductor 100 includes one or more conductors, such as first conductor 110 and second conductor 115, each of which may include a pad 120 or other connection element at each end of the conductor. The inductor further includes a magnetic film material 125, wherein such material may include a first layer of magnetic film material above the conductors 110-115 and a second layer of magnetic film material below the conductors 110-115. In some embodiments, the magnetic film material is composed of the illustrated CZT (CoZrTa) or other cobalt alloy or other high permeability material, such as, for example, Permalloy, CoZrNb, CoZrTaN (Cobalt Zirconium Tantalum Nitride), CoFeHfO (Cobalt Iron Hafnium Oxide), CoP, FeCoP (Iron Cobalt Phosphorus), CoPRe (Cobalt Phosphorus Rhenium), CoPFeRe (Cobalt Phosphorus Iron Rhenium), CoPW (Cobalt Phosphorus Tungsten), CoPBW (Cobalt Phosphorus Boron Tungsten), NiFe (Nickel Iron), FeCo (Iron Cobalt), CoZr (Cobalt Zirconium), CoZrFe (Iron Cobalt Zirconium), CoZrTaB (Cobalt Zirconium Tantalum Boron), CoFeB (Iron Cobalt Boron), CoZrB (Cobalt Zirconium Boron), CoZrMo (Cobalt Zirconium Molybdenum), FeCoAlN (Iron Cobalt Aluminum Nitride), FeTaN (Iron Tantalum Nitride), and FeCoBSi (Iron Cobalt Boron Silicon).

Figure 2:
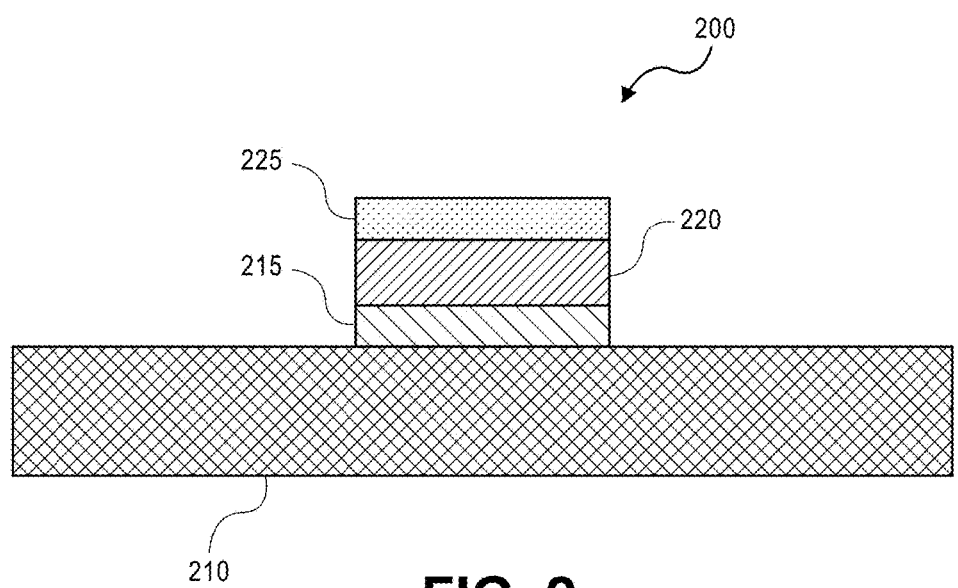
FIG. 2 is an illustration of an inductor including magnetic film material.

FIG. 2 is an illustration of an inductor including magnetic film material. As seen in the side view presented in FIG. 2, an inductor 200 includes a first layer of magnetic film material 215, such as, for example, CZT or other high permeability material, that is deposed on a substrate with silicon circuitry 210. One or more conductors 220 are installed on the first layer of magnetic film material 215. The inductor is then further processed to include a second layer of magnetic film material 225 that is deposed on the one or more conductors 220.

While the inductor illustrated as 100 in FIGS. 1 and 200 in FIG. 2 with upper and lower layers of magnetic film material provides certain advantages in terms of performance in comparison with, for example, an air-core inductor, the fabrication of the device is relatively expensive and time consuming because of the need to depose multiple layers of magnetic material using expensive deposition processes. Further, the resulting magnetic film material may include certain negative features, including saturation in certain conditions that results in losses and reduced performance. A particular challenge faced in implementing inductors in power delivery circuitry is that the magnetic material can saturate at high currents.

An additional difficulty with thin magnetic film inductors is that, in order to obtain high inductance densities, the magnetic material would need to completely wrap around the conductors to provide a path for the magnetic flux, which is challenging with the deposition of magnetic film material. Conventional deposition of a magnetic film material such as illustrated in FIG. 2 results in a material in which there are gaps between the top 215 and bottom 225 layers of magnetic film materials. If the magnetic flux path has large gaps, such as when there is no magnetic material on one or more sides of the conductor, then the inductance of the device drops significantly.

Figure 3:
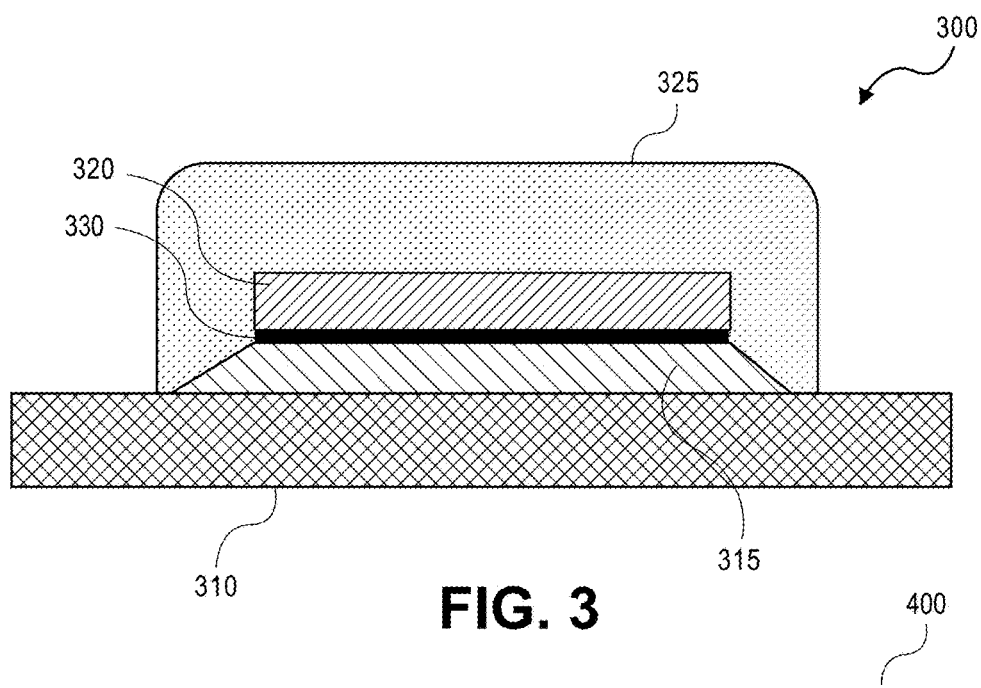
FIG. 3 is an illustration of a hybrid magnetic material inductor including magnetic particle material for a second layer of magnetic material according to an embodiment.

In some embodiments, the inductor 100 in FIG. 1 or inductor 200 is modified to replace the top layer 225 of magnetic film material with micron sized magnetic particles, such as magnetic particles between 0.5 and 10 microns in diameter, which may also be referred to micro-powder magnetics. FIG. 3 is an illustration of a hybrid magnetic material inductor including magnetic particle material for a second layer of magnetic material according to an embodiment. In some embodiments, as illustrated in FIG. 3, a hybrid magnetic material inductor 300 includes a first layer of high-permeability magnetic film material 315, such as CZT, that is deposited on a substrate with silicon (or other semiconductor material) circuitry 310, such as by sputter deposition. In some embodiments, the magnetic material may be deposited and then tapered, as shown in FIG. 3, to provide improved contact.

In some embodiments, one or more conductors 320 are deposited directly on the first layer of magnetic film material 315. In some embodiments, there may further be a layer of insulating material 330 (also referred to an insulating layer) on the magnetic film material 315, the one or more conductors being deposited directly on the insulating material 330 rather than directly on the magnetic film material. The inductor 300 is then further processed to include a second layer of magnetic film material, wherein the second layer of magnetic material includes a coating of powdered magnetic material 325 that is formed on the one or more conductors 320. In some embodiments, the powered magnetic material is applied by 3D printing technologies or other similar processes. In some embodiments, the magnetic power includes powdered magnetic particles such as carbonyl iron particles that may be near micron size. For example, the magnetic particles may be in the range of 0.5 to 10.0 microns in diameter. In some embodiments, the magnetic particles are applied in an insulating medium such as a polyimide or an adhesive.

In some embodiments, requiring only one layer of high-permeability magnetic film material 315, which is deposited using high-vacuum sputter deposition systems or other deposition system, together with magnetic particle material in the hybrid magnetic material inductor 300 serves to simplify the fabrication process for the inductor and reduce the cost of such fabrication.

In some embodiments, the top layer of powered magnetic material 325 may be applied in a manner to surround the one or more conductors 320, thereby acting to improve the overall inductance provided by the hybrid magnetic material inductor structure. A difficulty with thin film inductors is that to obtain optimized inductance densities, the magnetic material would need to completely wrap around the conductors to provide a path for the magnetic flux. If the path has large gaps in the magnetic material on one or more sides of the conductor, then the inductance drops significantly. In some embodiments, the micro-powder magnetics may be easily applied to wrap around the sides of the conductors, thereby providing an improved magnetic flux path.

In some embodiments, the hybrid magnetic material inductor 300 may be implemented to reduce losses in comparison with a conventional magnetic film inductor. The hybrid magnetic material inductor 300 may not saturate as easily as conventional devices at higher frequencies. A magnetic powder implemented in an embodiment may possess a higher saturation magnetization, in comparison with a high-permeability magnetic film inductor because the space between the magnetic particles in the matrix act as an air gap, which thus can significantly improve the saturation of the magnetic material.

Further, a hybrid magnetic material inductor 300 may be implemented with an improved response at higher frequencies, such as with frequencies above 700 MHz, in comparison with a conventional inductor structure using two levels of high-permeability magnetic material. This improvement in frequency response occurs in part because eddy currents are reduced due to the powdered magnetic material having a high resistivity in comparison with conventional magnetic film material.

In some embodiments, a hybrid magnetic material inductor includes a first high-permeability thin film magnetic material layer that is fabricated beneath one or more conductors, wherein the first layer may be deposited using equipment such as physical vapor deposition (PVD) or electroplating, and a second magnetic material layer above the one or more conductors, the magnetic material consisting of a thick micrometer powder magnetic material in a matrix.

In some embodiments, the particles of magnetic powder may be applied using one or more particle application processes, which may include, but are not limited to:

(a) The magnetic particles may be applied using 3D printing techniques, wherein the powder is incorporated into a suitable ink (or other carrier) and deposited using a printing head or other similar applicator.

(b) The magnetic particles may be deposited using cold spraying techniques, wherein the particles are accelerated at supersonic speed onto a substrate, thereby forming a coating.

(c) The magnetic powder material may be incorporated into dielectrics that are deposited using spin coatings or screen printing, such as the polyimides currently used in microchip technology. In some embodiments, a process combines the dielectric process step (including a patterning step) with the incorporation of the magnetic material, and thus eliminates the deposition step that would subsequently follow the polyimide deposition step in the fabrication of a conventional magnetic film material inductor.

In some embodiments, the high-permeability magnetic material of the first layer of magnetic film material 315 may be laminated and then tapered, such as illustrated in FIG. 3. The tapering may be implemented to allow for a better coupling between the two differing magnetic materials, and further to reduce the eddy currents that would otherwise flow in the outer edges of the magnetic material.

In some embodiments, the magnetic powder is applied to coat the sidewalls and/or fill the magnetic vias to increase the inductance of the inductor structure, with the levels of magnetic material above and below the conductor. The side coating of magnetic particle material may become important if thicker conductors are implemented in an inductor as the increased thickness of the conductors makes it more challenging to form a magnetic via between the bottom magnetic film layer and the top magnetic particle layer.

In some embodiments, the magnetic power can be applied in a solenoid-like structure to provide a magnetic pathway in structures where the anisotropic nature of the magnetic material does not provide a pathway for the magnetic flux when wrapping around the outside of the solenoid.

In some embodiments, a coating formed using the magnetic powder may be utilized for other purposes for electronic devices and circuits, including application of the coating as a shielding against EMI (electromagnetic interference) noise for electronic devices and circuits at the package or board level.

Figure 4:
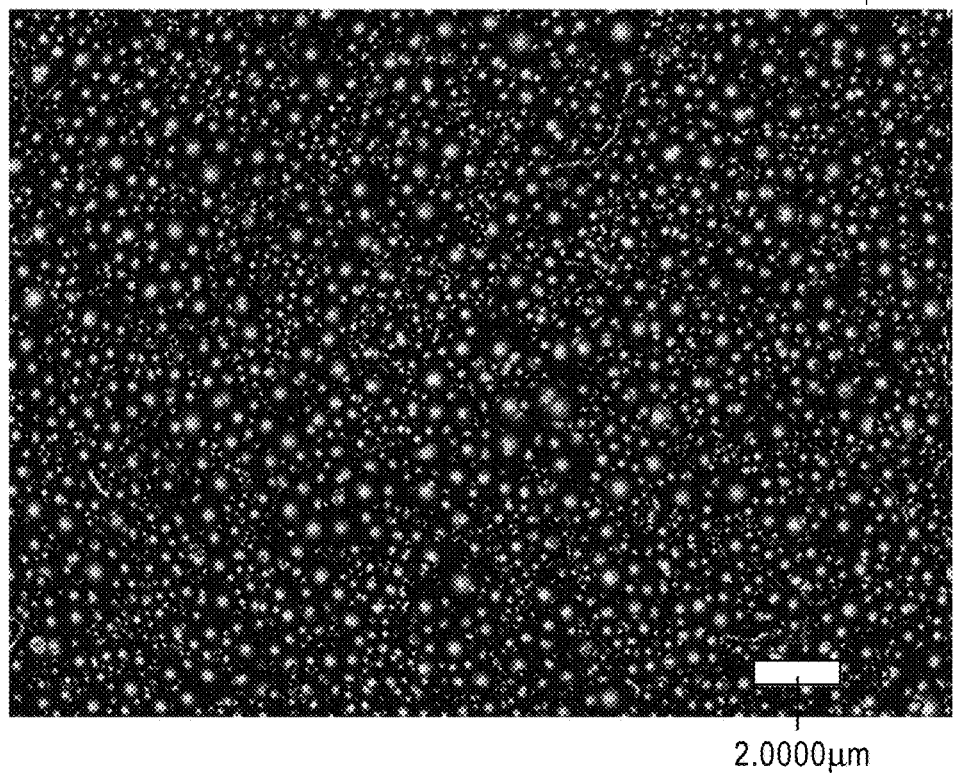
FIG. 4 is an illustration of magnetic particles to be implemented in an electronic device or circuit according to an embodiment.

FIG. 4 is an illustration of magnetic particles to be implemented in an electronic device or circuit according to an embodiment. For purposes of the illustration, the magnetic material was fabricated by mixing the magnetic particles in alcohol then depositing such material using a pipette. In some embodiments, the magnetic particles 400 may be selected from one of the many high-frequency carbonyl powders. In some embodiments, particles may have a median particle size of approximately 2.5 microns. However, embodiments are not limited to a particular size of particle. In some embodiments, magnetic particles may be in a range of 0.5 to 10.0 microns.

Figure 5:
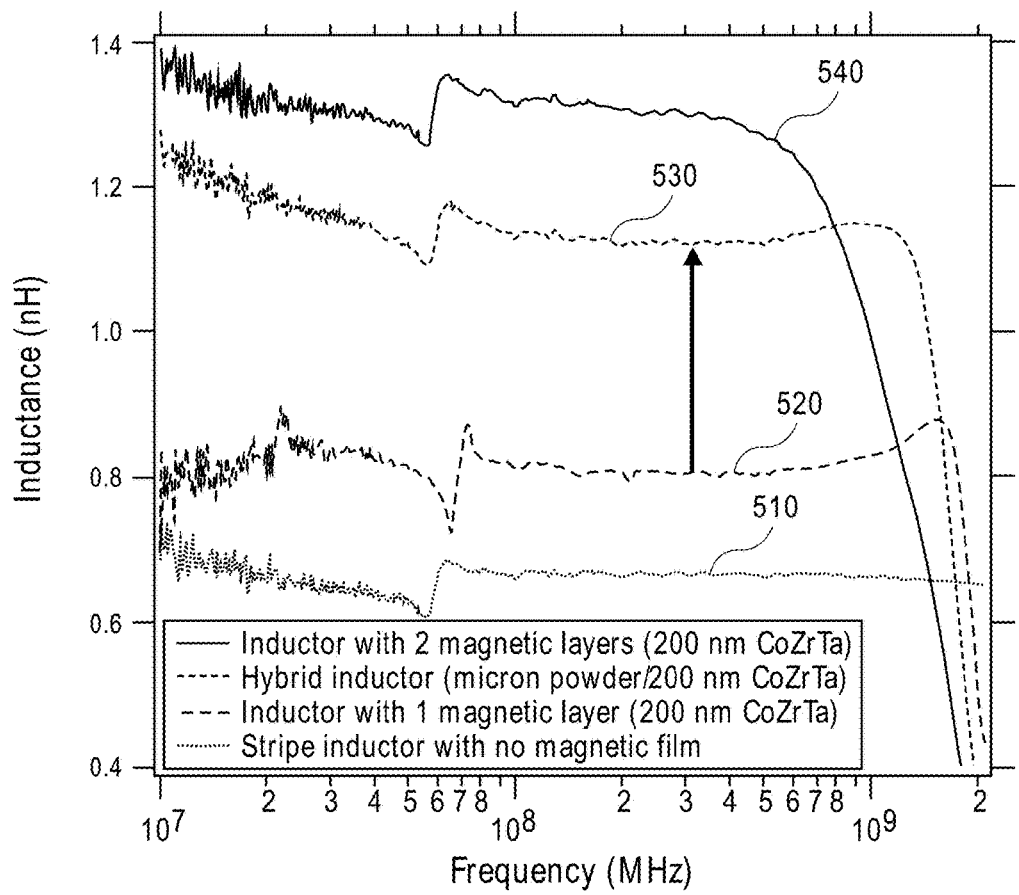
FIG. 5 is an illustration of inductance versus frequency for conventional and hybrid magnetic material inductors according to an embodiment.

FIG. 5 is an illustration of inductance versus frequency for conventional and hybrid magnetic material inductors according to an embodiment. The graph of inductance in nH (nanohenries) versus frequency in MHz (megahertz) illustrated in FIG. 5 provides curves for a stripe inductor with no magnetic film 510; an inductor with a single magnetic film layer 520 (a 200 nm thick CoZrTa layer); a hybrid magnetic material inductor 530 (including a 200 nm thick CoZrTa layer beneath the conductor and a mixture of micro-powder carbonyl iron in an insulating medium such as a polyimide or an adhesive above the conductor); and an inductor with both upper and lower layers of magnetic film material 540 (two 200 nm thick CoZrTa layers that surround or encompass the conductor at least in part).

As shown in FIG. 5, the inductance achieved with the hybrid inductor is higher than that achieved with just one layer of magnetic material, while being lower than that achieved with two levels of high-permeability material below a frequency of approximately 700 MHz (megahertz). However, the hybrid magnetic material inductor 530 is simpler and less expensive to fabricate in comparison with an inductor having a second sputter deposited high-permeability magnetic material layer 540, wherein the magnetic film is generally deposited using an expensive sputter deposition vacuum system. In addition, it is noted that in this example the high frequency response above 700 MHz and the loss tangent are better with the hybrid magnetic material inductor 530 than the conventional two magnetic film layer inductor 540, and thus the hybrid magnetic material structure may provide superior performance in comparison with conventional technology in certain applications, such as, for example, in RF (radio frequency) circuits.

Figure 6:
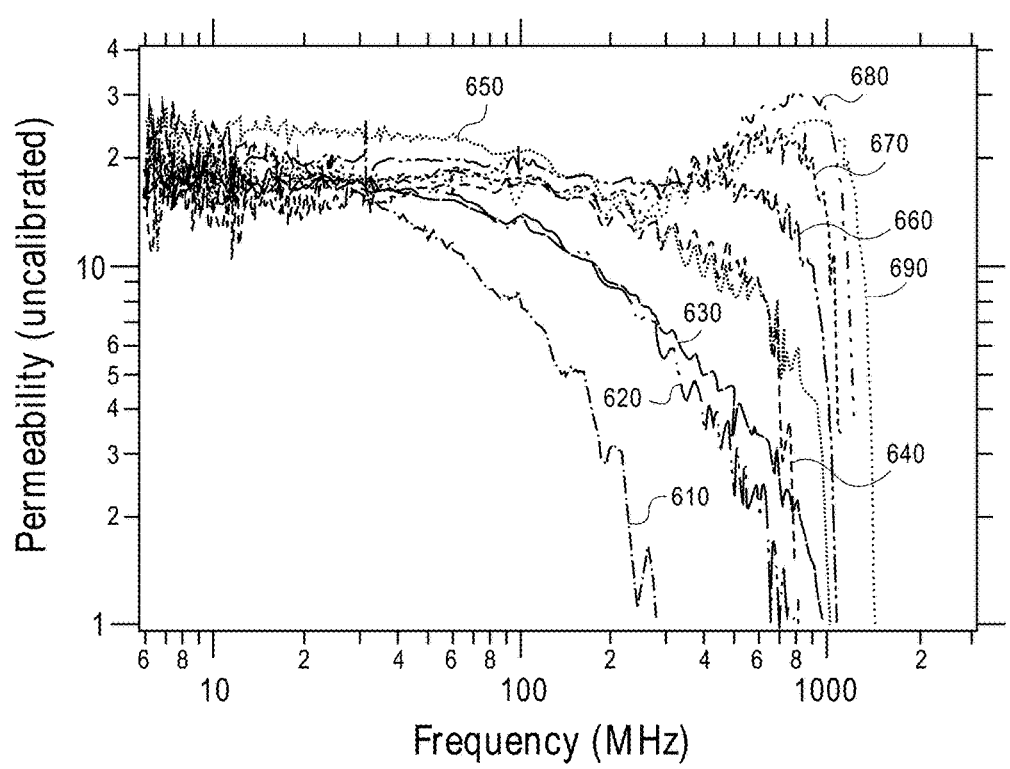
FIG. 6 is an illustration of permeability versus frequency for magnetic particles for use in a hybrid magnetic material inductor or other electronic devices or circuit applications according to an embodiment.

FIG. 6 is an illustration of permeability versus frequency for magnetic particles for use in a hybrid magnetic material inductor or other electronic devices or circuit applications according to an embodiment. FIG. 6 provides an illustration of measured permeability versus frequency of certain magnetic micron-size particles. The illustrated particles are ferrite particles (particle diameter=300 nm) 610, as frequently used in discrete inductors; soft particles for inductors (3.0-5.0 µm) 620; soft coated, low loss particles (3.9-5.0 µm) 630; hard insulated particles (3.0-4.0 µm) 640; soft particles (3.0-4.5 µm) 650; hard (anodized) particles (2.5 µm) 660; hard particles (1.8-2.3 µm) 670; hard particles (2.0 µm) 680; and hard particles (2.5 µm) 690. As illustrated, hard anodized micron-size particles have the best frequency response among the illustrated example, and therefore provide the lowest loss. However, the choice of particle size and material in an implementation may further depend on other factors, including, for example, ease of application, durability of resulting coatings, and other issues.

Figure 7:
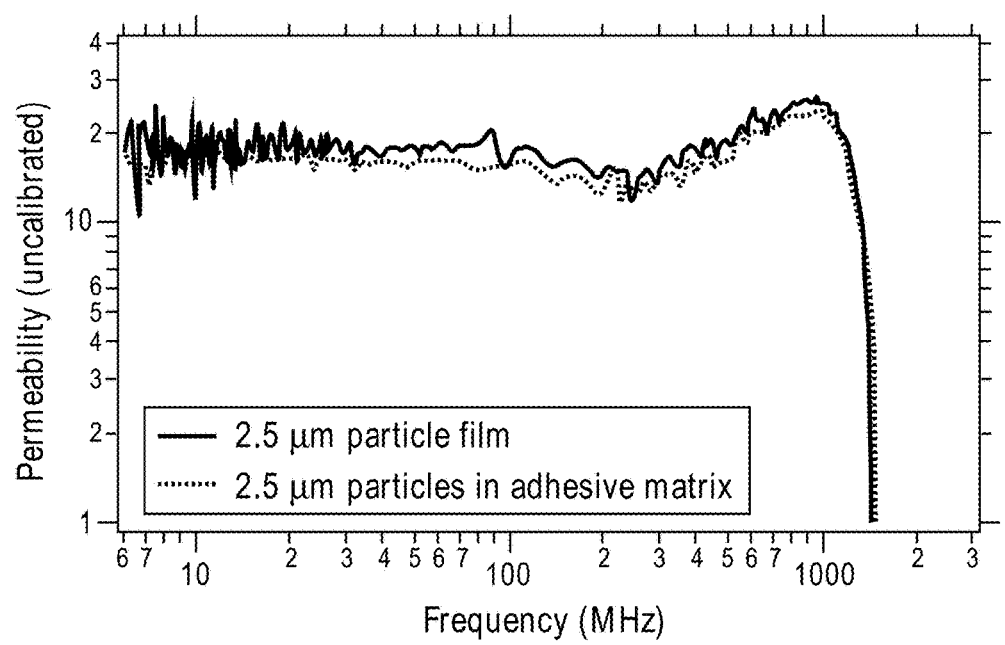
FIG. 7 is an illustration of permeability versus frequency for particles for use in a hybrid magnetic material inductor or other electronic devices or circuit applications according to an embodiment.

FIG. 7 is an illustration of permeability versus frequency for particles for use in a hybrid magnetic material inductor or other electronic devices or circuit applications according to an embodiment. FIG. 7 provides an illustration of measured permeability versus frequency of the magnetic micron-size particles providing the best response, as illustrated in FIG. 6 (hard particles of 2.5 µm diameter) when suspended in an adhesive matrix such as could be utilized with 3D printing, as compared to a film of particles without application in a matrix. As shown in FIG. 7, the permeability spectrum is similar for both materials, thus illustrating the utility of application of such magnetic materials in an insulating medium such as a polyimide or adhesive.

Figure 8:
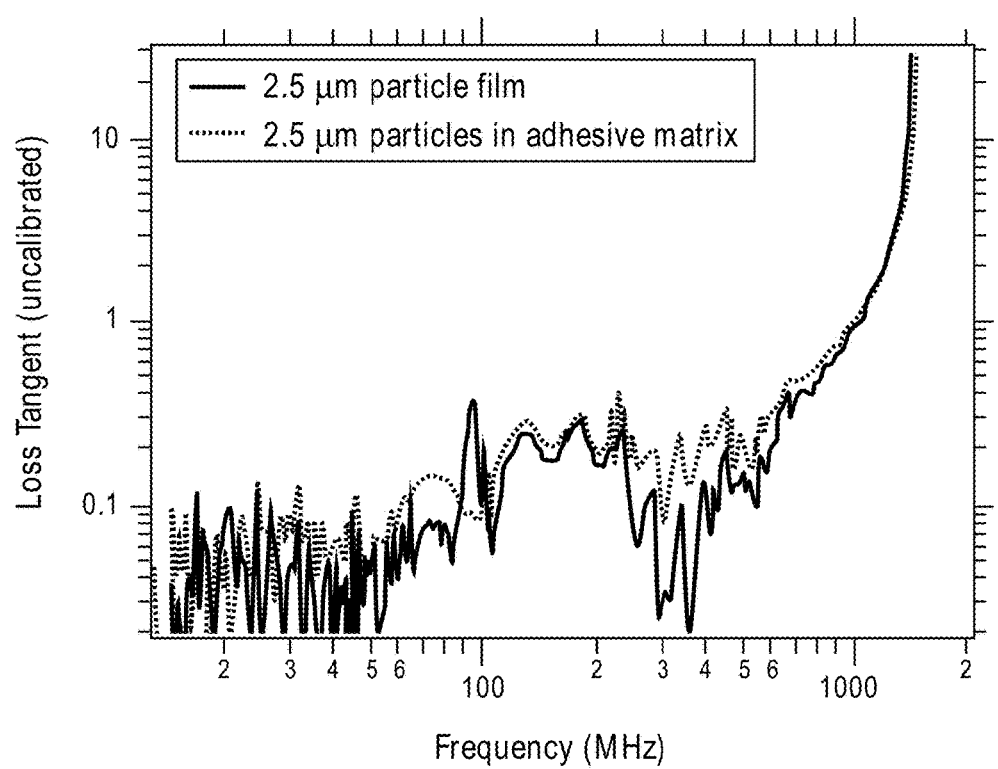
FIG. 8 is an illustration of loss tangent versus frequency of magnetic particles for use in a hybrid magnetic material inductor or other electronic devices or circuit applications according to an embodiment.

FIG. 8 is an illustration of loss tangent versus frequency of magnetic particles for use in a hybrid magnetic material inductor or other electronic devices or circuit applications according to an embodiment. As shown in FIG. 8, the loss tangent of the magnetic particle film and magnetic particles in an adhesive matrix versus frequency are very similar, and provide values that are below a detectable limit (0.1 value for the loss tangent in the uncalibrated scale) as frequencies fall below 100 MHz, which would commonly include frequencies of interest for power delivery.

Figure 9:
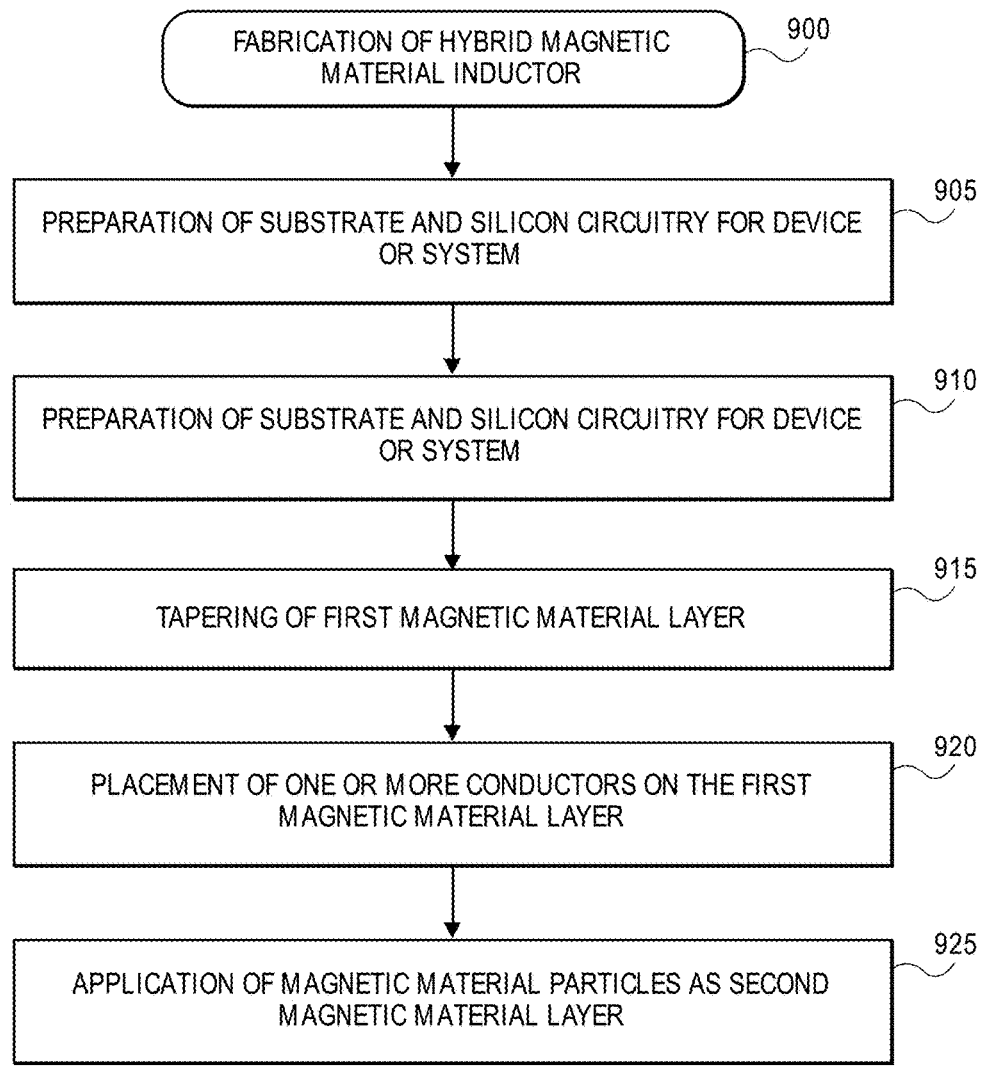
FIG. 9 is an illustration of a process for fabrication of a hybrid magnetic material inductor or other electronic device or circuit application according to an embodiment.

FIG. 9 is an illustration of a process for fabrication of a hybrid magnetic material inductor or other electronic device or circuit application according to an embodiment. In some embodiments, a process 900 may include preparation of a substrate and silicon circuitry for a device or system 905. In some embodiments, for the fabrication of an inductor, the process includes deposition of a magnetic film layer for a stripe inductor 910, wherein the magnetic film layer is to provide a first, lower magnetic layer for the device or system. In some embodiments, the first magnetic layer is composed of CZT or other known magnetic film material. In some embodiments, the first magnetic material may be tapered after application 915 to provide for a better contact with a second layer to be added. In some embodiments, the process further includes the placement of one or more conductors of the inductor onto the first magnetic film layer 920 or onto an insulating layer on the magnetic film. In an alternative embodiment for the application of material as electromagnetic shielding, the process may include the installation of other electronic device and circuit elements.

In some embodiments, the process continues with the application of micron-sized magnetic particles as a second magnetic material layer 925. In some embodiments, the magnetic particles are suspended in an insulating medium, such as a polyimide or adhesive. In some embodiments, the application of the magnetic material may include one of a number of particle application techniques, including, but not limited to, 3D printing; cold spraying techniques, wherein the particles are accelerated at supersonic speed onto a substrate to form a coating; or spin coating or screen printing together with dielectrics in the fabrication of a microchip.

Figure 10:
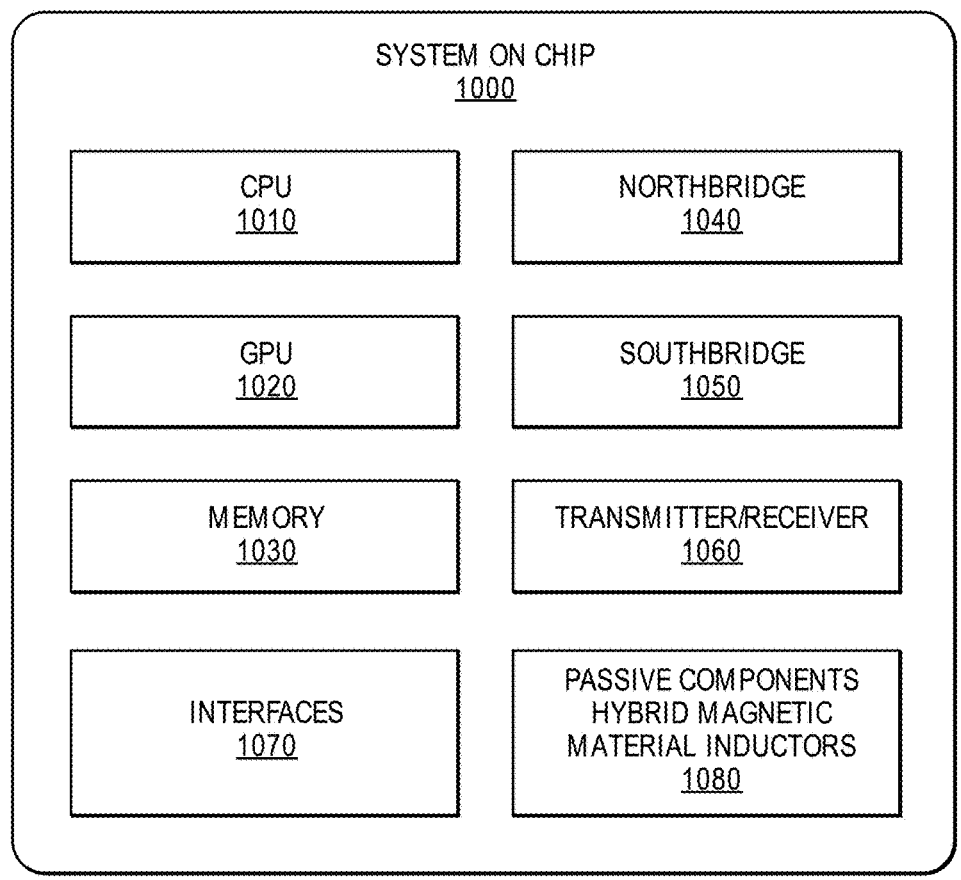
FIG. 10 is an illustration of a system on chip including an integrated hybrid magnetic material inductor according to an embodiment.

FIG. 10 is an illustration of a system on chip including an integrated hybrid magnetic material inductor according to an embodiment. In some embodiments, a system on chip (SoC) includes one or more passive components, including one or more hybrid magnetic material integrated inductors 1080. In some embodiments, the hybrid magnetic material inductors may be as illustrated in FIGS. 3 and 4, including a first magnetic layer beneath one or more inductors having a magnetic film material and a second magnetic layer above the one or more conductors including micron-sized magnetic particles that have been applied to the inductor. It is noted that FIG. 10 is an example, and embodiments of devices including implementation of hybrid magnetic material inductors to SoC devices, but rather any device or packaged set of devices utilizing an integrated inductor to provide inductance in a circuit.

In some embodiments, the SoC 1000 may include, but is not limited to, the following:

(a) A central processing unit (CPU) or other processing element 1010 for the processing of data.

(b) A graphics processing unit (GPU) 1020 to create images for output to a display.

(c) Memory 1030, where memory may include random access memory (RAM) or other dynamic storage device or element as a main memory for storing information and instructions to be executed by the CPU 1010 and the GPU 1020. Main memory may include, but is not limited to, dynamic random access memory (DRAM). Memory 1030 may further include a non-volatile memory and a read only memory (ROM) or other static storage device for storing static information and instructions for the CPU 1010 and GPU 1020.

(d) A Northbridge 1040 to handle communications between the CPU and other component of the SoC. In some embodiments, the SoC 1000 may further include a Southbridge 1050 to handle I/O functions.

(e) A transmitter, receiver, or both 1060 for the transmission and reception of data via wireless communications. Wireless communication includes, but is not limited to, Wi-Fi, Bluetooth™, near field communication, and other wireless communication standards.

(f) One or more interfaces 1070, including USB (Universal Serial Bus, Firewire, Ethernet, or other interfaces.

In the description above, for the purposes of explanation, numerous specific details are set forth in order to provide a thorough understanding of the described embodiments. It will be apparent, however, to one skilled in the art that embodiments may be practiced without some of these specific details. In other instances, well-known structures and devices are shown in block diagram form. There may be intermediate structure between illustrated components. The components described or illustrated herein may have additional inputs or outputs that are not illustrated or described.

Various embodiments may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

Portions of various embodiments may be provided as a computer program product, which may include a computer-readable medium having stored thereon computer program instructions, which may be used to program a computer (or other electronic devices) for execution by one or more processors to perform a process according to certain embodiments. The computer-readable medium may include, but is not limited to, magnetic disks, optical disks, read-only memory (ROM), random access memory (RAM), erasable programmable read-only memory (EPROM), electrically-erasable programmable read-only memory (EEPROM), magnetic or optical cards, flash memory, or other type of computer-readable medium suitable for storing electronic instructions. Moreover, embodiments may also be downloaded as a computer program product, wherein the program may be transferred from a remote computer to a requesting computer.

Many of the methods are described in their most basic form, but processes can be added to or deleted from any of the methods and information can be added or subtracted from any of the described messages without departing from the basic scope of the present embodiments. It will be apparent to those skilled in the art that many further modifications and adaptations can be made. The particular embodiments are not provided to limit the concept but to illustrate it. The scope of the embodiments is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments, various features are sometimes grouped together in a single embodiment, figure, or description thereof for the purpose of streamlining the disclosure and aiding in the understanding of one or more of the various novel aspects. This method of disclosure, however, is not to be interpreted as reflecting an intention that the claimed embodiments requires more features than are expressly recited in each claim. Rather, as the following claims reflect, novel aspects lie in less than all features of a single foregoing disclosed embodiment. Thus, the claims are hereby expressly incorporated into this description, with each claim standing on its own as a separate embodiment.

In some embodiments, an inductor includes a first layer of magnetic film material applied on a substrate; one or more conductors placed on the first layer of magnetic film material; and a second layer of magnetic particles, the magnetic particles being suspended in an insulating medium.

In some embodiments, the second layer is a coating applied with a particle application process. In some embodiments, the particle application process includes one or more of 3D printing; cold spraying; spin coating; or screen printing.

In some embodiments, the insulating medium includes one of a polyimide or an adhesive.

In some embodiments, the magnetic particles include carbonyl iron particles. In some embodiments, the carbonyl iron particles are anodized. In some embodiments, the magnetic particles have a diameter in a range of 0.5 micrometers to 10.0 micrometers.

In some embodiments, the second layer is wrapped around one or more sides of the inductor and is in contact with the first layer.

In some embodiments, the magnetic film material includes one or more of a cobalt alloy, a nickel alloy, iron alloy, Permalloy (alloy of nickel and iron), or other soft magnetic material. In some embodiments, a cobalt alloy is one of CZT (CoZrTa, or Cobalt Zirconium Tantalum), CoZrNb (Cobalt Zirconium Niobium), or CoP (Cobalt Phosphorus).

In some embodiments, the first layer is applied by sputter deposition or electroplating of the magnetic film material.

In some embodiments, the inductor further includes an insulating layer fabricated on a surface of the first layer of magnetic film material, wherein the second layer of magnetic particles is deposited on the insulating layer.

In some embodiments, a method includes applying a first layer of magnetic film material on a substrate; placing one or more conductors placed on the first layer of magnetic film material; and applying a second layer of magnetic particles, the magnetic particles being suspended in an insulating medium.

In some embodiments, applying the second layer includes applying a coating with a particle application process. In some embodiments, applying the second layer includes one or more additive manufacturing techniques, the techniques including 3D printing; cold spraying; spin coating; or screen printing.

In some embodiments, the insulating medium includes one of a polyimide or an adhesive.

In some embodiments, applying the second layer includes applying carbonyl iron particles.

In some embodiments, applying the first layer includes applying one or more of a cobalt alloy, a nickel alloy, an iron alloy, Permalloy (alloy of nickel and iron), or other soft magnetic material. In some embodiments, a cobalt alloy is one of CZT (CoZrTa, or Cobalt Zirconium Tantalum), CoZrNb (Cobalt Zirconium Niobium), or CoP (Cobalt Phosphorus).

In some embodiments, applying the first layer includes sputter deposition or electroplating of the magnetic film material.

In some embodiments, the method further includes fabricating an insulating layer on a surface of the first layer of magnetic film material, the second layer of magnetic particles being applied on the insulating layer.

In some embodiments, the method further includes tapering one or more sides of the first layer.

In some embodiments, applying the second layer of magnetic particles includes applying the second layer around one or more sides of the inductor, the second layer being applied to contact the one or more tapered sides of the first layer.

In some embodiments, a method for generating electromagnetic shielding includes fabricating an electronic device or circuit on a circuit board or package; and applying an electromagnetic coating on all or a portion of electronic device or circuit. In some embodiments, applying the electromagnetic coating includes applying a layer of magnetic particles with a particle application process, the magnetic particles being suspended in an insulating medium.

In some embodiments, the particle application process includes one or more of 3D printing; cold spraying; spin coating; or screen printing. In some embodiments, the magnetic particles include carbonyl iron particles.

In some embodiments, a system on chip (SoC) includes a central processing unit (CPU); memory to store data for the CPU; a transmitter or receiver for transmitting or receiving data via wireless communication; and one or more passive components including one or more hybrid magnetic material inductors, a hybrid magnetic material inductor including a first layer of magnetic film material applied on a substrate; one or more conductors placed on the first layer of magnetic film material; and a second layer of magnetic particles, the magnetic particles being suspended in an insulating medium.

In some embodiments, the second layer is a coating applied with a particle application process. In some embodiments, the particle application process includes one or more of 3D printing; cold spraying; spin coating; or screen printing.

What is claimed is:

1. An inductor comprising:
   a first layer of magnetic film material applied on a substrate, wherein the first layer has a top surface with one or more tapered sides;
   an insulating layer disposed on a surface of the first layer of magnetic film material;
   one or more conductors placed directly on the insulating layer above the first layer of magnetic film material, wherein the insulating layer and the conductors have approximately the same lateral width; and
   a second layer of magnetic particles, the magnetic particles being suspended in an insulating medium, wherein the second layer is disposed on and around one or more sides of the one or more conductors, one or more sides of the insulating layer, and the one or more tapered sides of the first layer.

2. The inductor of claim 1, wherein the second layer is a coating applied with a particle application process.

3. The inductor of claim 2, wherein the particle application process includes one or more of:
   3D printing;
   cold spraying;
   spin coating; or
   screen printing.

4. The inductor of claim 1, wherein the insulating medium includes one of a polyimide or an adhesive.

5. The inductor of claim 1, wherein the magnetic particles include carbonyl iron particles.

6. The inductor of claim 5, wherein the carbonyl iron particles are anodized.

7. The inductor of claim 1, wherein the magnetic particles have a diameter in a range of 0.5 micrometers to 10.0 micrometers.

8. The inductor of claim 1, wherein the second layer is wrapped around one or more sides of the inductor and is in contact with the first layer.

9. The inductor of claim 1, wherein the magnetic film material includes one or more of a cobalt alloy, a nickel alloy, an iron alloy, Permalloy (alloy of nickel and iron), or other soft magnetic material.

10. The inductor of claim 9, wherein a cobalt alloy is one of CZT (CoZrTa, or Cobalt Zirconium Tantalum), CoZrNb (Cobalt Zirconium Niobium), or CoP (Cobalt Phosphorus).

11. The inductor of claim 1, wherein the first layer is applied by sputter deposition or electroplating of the magnetic film material.

12. A method to fabricate an inductor comprising:
    applying a first layer of magnetic film material on a substrate, wherein the first layer has a top surface with one or more tapered sides;
    disposing an insulating layer on a surface of the first layer of magnetic film material;
    placing one or more conductors placed directly on the insulating layer above the first layer of magnetic film material, wherein the insulating layer and the conductors have approximately the same lateral width; and
    applying a second layer of magnetic particles, the magnetic particles being suspended in an insulating medium, wherein the second layer is disposed on and around one or more sides of the one or more conductors, one or more sides of the insulating layer, and the one or more tapered sides of the first layer.

13. The method of claim 12, wherein applying the second layer includes applying a coating with a particle application process.

14. The method of claim 13, wherein applying the second layer includes one or more additive manufacturing techniques, the techniques including:
    3D printing;
    cold spraying;
    spin coating; or
    screen printing.

15. The method of claim 12, wherein the insulating medium includes one of a polyimide or an adhesive.

16. The method of claim 12, wherein applying the second layer includes applying carbonyl iron particles.

17. The method of claim 12, wherein applying the first layer includes applying one or more of a cobalt alloy, a nickel alloy, an iron alloy, Permalloy (alloy of nickel and iron), or other soft magnetic material.

18. The method of claim 17, wherein a cobalt alloy is one of CZT (CoZrTa, or Cobalt Zirconium Tantalum), CoZrNb (Cobalt Zirconium Niobium), or CoP (Cobalt Phosphorus).

19. The method of claim 12, wherein applying the first layer includes sputter deposition or electroplating of the magnetic film material.

20. The method of claim 12, further comprising tapering one or more sides of the first layer.

21. The method of claim 20, wherein applying the second layer of magnetic particles includes applying the second layer around one or more sides of the inductor, the second layer being applied to contact the one or more tapered sides of the first layer.

22. A method for generating electromagnetic shielding comprising:
    fabricating an electronic device or circuit on a circuit board or package;
    applying a layer of magnetic film material on the circuit board or package, wherein the layer of magnetic film material has a top surface with one or more tapered sides; disposing an insulating layer on a surface of the layer of magnetic film material; and applying an electromagnetic coating on all or a portion of electronic device or circuit, wherein the electronic device or circuit is placed directly on the insulating layer above the first layer of magnetic film material, wherein the insulating layer and the electronic device or circuit have approximately the same lateral width;
    wherein applying the electromagnetic coating includes applying a layer of magnetic particles with a particle application process, the magnetic particles being suspended in an insulating medium, wherein the layer of magnetic particles is disposed on and around one or more sides of all or the portion of electronic device or circuit, one or more sides of the insulating layer, and the one or more tapered sides of the layer of magnetic film material.

23. The method of claim 22, wherein the particle application process includes one or more of:
   3D printing;
   cold spraying;
   spin coating; or
   screen printing.

24. The method of claim 22, wherein the magnetic particles include carbonyl iron particles.

25. A system on chip (SoC) comprising:
   a central processing unit (CPU);
   memory to store data for the CPU;
   a transmitter or receiver for transmitting or receiving data via wireless communication; and
   one or more passive components including one or more hybrid magnetic material inductors, a hybrid magnetic material inductor including:
   a first layer of magnetic film material applied on a substrate, wherein the first layer has a top surface with one or more tapered sides;
   an insulating layer disposed on a surface of the first layer of magnetic film material;
   one or more conductors placed directly on the insulating layer above the first layer of magnetic film material, wherein the insulating layer and the conductors have approximately the same lateral width; and
   a second layer of magnetic particles, the magnetic particles being suspended in an insulating medium, wherein the second layer is disposed on and around one or more sides of the one or more conductors, one or more sides of the insulating layer, and the one or more tapered sides of the first layer.

26. The system on chip of claim 25, wherein the second layer is a coating applied with a particle application process.

27. The system on chip of claim 26, wherein the particle application process includes one or more of:
   3D printing;
   cold spraying;
   spin coating; or
   screen printing.

* * * * *